United States Patent [19]
Lee

[11] Patent Number: 5,939,756
[45] Date of Patent: Aug. 17, 1999

[54] ADDED P-WELL IMPLANTATION FOR UNIFORM CURRENT DISTRIBUTION IN ESD PROTECTION DEVICE

[75] Inventor: Jian-Hsing Lee, Hsin-Chu, Taiwan

[73] Assignee: Taiwan Semiconductor Manufacturing Co. Ltd., Hsin-Chu, Taiwan

[21] Appl. No.: 08/891,379

[22] Filed: Jul. 11, 1997

[51] Int. Cl.$^6$ .................................................. H01L 29/72
[52] U.S. Cl. ......................... 257/355; 257/357; 257/360; 257/371
[58] Field of Search .................................. 257/355, 357, 257/360, 371

[56] References Cited

U.S. PATENT DOCUMENTS 5,872,379  2/1999  Lee ........................................... 257/355

Primary Examiner—Edward Wojciechowicz
Attorney, Agent, or Firm—Tung & Associates

[57] ABSTRACT

An apparatus and method are disclosed for enhancing the operation of ESD protective circuits in a VLSI chip with a plurality of parallel CMOS devices therein, particularly a plurality of NMOS devices arranged as parallel N-P-N bipolars. In the MOSFET circuits, a number of sets of cooperating N+ regions are deposited in a P-well in a P-type substrate to form, with electrodes and connections, a set of parallel source-base-drain transistors. The ESD pass voltage is effected by different processes due to the current-crowding effect. The current distribution in each of the N-P-N bipolars is strongly dependent on the P-well resistivity so that to reduce the current crowding effect and render the current distribution uniform in each parallel N-P-N bipolar, an additional P-well implantation is used to reduce the P-well resistivity in the input, I/O, and output buffer ESD protection circuits. Accordingly, the effective protection width will be increased and the ESD performance is improved.

9 Claims, 2 Drawing Sheets

ADDED P-WELL IMPLANTATION FOR UNIFORM CURRENT DISTRIBUTION IN ESD PROTECTION DEVICE

FIELD OF THE INVENTION

The present invention generally relates to electrostatic discharge (ESD) stress protection devices for VLSI semiconductor circuits and, more particularly, to a method and means for producing uniform current distribution in an ESD protection device by utilizing an added P-well implantation.

BACKGROUND OF THE INVENTION

With recent advances in the development of high density very large scale integration (VLSI) circuits, the dimensions of the devices continue to shrink resulting in a corresponding decrease in the gate oxide thicknesses in the CMOS devices. This decrease, relative to breakdown voltage, has resulted in the greater susceptibility of these devices to damage from the application of excessive voltages such as caused by an electrostatic discharge (ESD) event. During an ESD event, charge is transferred between one or more pins of the integrated circuits and another conducting object in a short period of time, typically less than one microsecond. The charge transfer generates voltages that are large enough to break down insulating films, e.g., gate oxides on MOSFET devices, or that can dissipate sufficient energy to cause electrothermal failures in the devices. Such failures include contact spiking, silicon melting, or metal interconnect melting. Consequently, in order to deal with transient ESD pulses, an integrated circuit must incorporate protection circuits at every input and I/O pin. Various circuit structures for ESD protection can be found, e.g., in U.S. Pat. Nos. 5,019,888 to Scott et al; 5,182,220 to Ker et al; 5,218,222 to Roberts; and 5,329,143 to Chan; and in the literature in "Internal Chip ESD Phenomena Beyond the Protection Circuit", C. Duvvury, IEEE Transactions on Electron Devices, Vol.35, No.12, December 1988; "A Low-Voltage Triggering SCR for On-Chip ESD Protection at Output and Input Pads", A. Chatterjee, IEEE Electron Device Letters, Vol.12, No.1, January 1991; and "ESD Protection in a Mixed Voltage Interface and Multi-Rail Disconnected Power Grid Environment in 0.50- and 0.25-$\mu$m Channel Length CMOS Technologies", S. Voldman, EOS/ESD Symposium Proceedings, pp. 125–134, 1994.

An example of one form of ESD protection device of the general type such as discussed in the above-cited U.S. Pat. No. 5,329,143 to T. C. CHAN ET AL, is shown in FIG. 1 in cross-section embodying a known low-voltage integrated circuit (IC) device 10, in the form of a MOSFET gate with PMOS and NMOS transistors 2 and 4 indicated schematically in FIG. 1A. Device 10 is fabricated from a semiconductor substrate 12 of a first conductivity type, such as P+ conductivity, with various diffusions and circuit components formed thereon to provide protection against ESD damage due to excessive stresses. Included is the thin-oxide NMOS transistor or N-channel device 4, composed of N+ regions, 18 and 20, having a gate electrode 22 with a thin oxide 24 therebetween, and disposed in a P-well region 26. The outer N+ region 20 of MOSFET 4 is connected to a contact 28, that may be coupled to a voltage source, an I/O pad, or the IC internal circuits, and the inner N+ region 18 is coupled to an adjacent outer P+ conductivity region 14 by a contact or bus 16 which is connected to a negative voltage source VSS or ground. The NMOS thick-field device 4 deals with either positive or negative ESD stresses developed between the Vss voltage on contact 16 and the voltage communicated from the contact 28. The N+ diffusion regions, 18 and 20, and underlying P-well 12 act as a bipolar device when there is an excessive positive stress on the contact 28 with respect to Vss, i.e., a parasitic lateral NPN transistor results, with its base at the P-well 12, its emitter at N+ region 18, and its collector or drain at N+ region 20. Punch through occurs at the NP junction (20,12), the drain breaks down, typically at about 13 volts, and current flows from contact 28 to ground through the N+ regions 20 and 18, to offer protection to the other circuit devices. Particularly, upon punch through the generated electrons are swept into the collector region 20. The generated holes injected into the base region 12 cause the substrate voltage to increase, forward biasing the emitter junction, and causing the NPN transistor to turn ON. As a consequence, injection of electrons from the emitter 18 into the base 12 is increased and those electrons reaching the collector-base junction (20,12) generate new electron hole pairs and current growth continues. This "positive feedback" would cause the emitter-to-collector current to increase indefinitely, resulting in damage to the device if the current is not somehow limited. Also, when a negative stress on the contact 28 with respect to Vss occurs, a forward biased diode would result between P+ region 14 and N+ region 20, through the P-well 12, that would turn ON to protect the other internal integrated devices.

A typical IC chip has a plurality of parallel NMOS devices formed therein as shown in FIG. 2. The chip layout shown has a 100 $\mu$m wide N+ source region on the left side and a 100 $\mu$m wide N+ drain region on the right side with a 0.85 $\mu$m polysilicon gate above and between them and a P+ substrate disposed 9 $\mu$m therefrom. An equivalent circuit schematic is seen in FIG. 3 showing the array of parallel NMOS devices T1, T2, T3, T4, . . . etc., and their respective base currents Ib1, Ib2, Ib3, Ib4 . . . etc., and drain currents Ic1, Ic2, Ic3, Ic4 . . . etc. The resistance Rsub between the substrate and T1, and the successive resistances between the successive devices ($\Delta$R) are indicated as R1, R2, R3, R4 . . . etc. The relationships among these parameters are as follows: R1<R2<R3<R4 . . . etc.; Ic1>Ic2>Ic3>Ic4 . . . etc.; and Ib1>Ib2>Ib3>Ib4 . . . etc. A problem with this arrangement, however, is that the ESD pass voltage is effected by different processes due to current crowding and the uniformity of the current distribution is effected. It is therefore desirable to be able to reduce the current crowding and produce a uniform current distribution as much as possible.

It is accordingly an object of the present invention to provide an enhanced ESD protection performance apparatus and method for protecting VLSI circuits and particularly parallel NMOS devices.

It is another object of the invention to provide an enhanced ESD protection performance apparatus and method for protecting VLSI circuits and particularly parallel NMOS devices that reduces current crowding and produces a more uniform current distribution.

It is further object of the invention to provide an enhanced ESD protection performance apparatus and method for protecting VLSI circuits and particularly parallel NMOS devices by utilizing an additional P-well implantation to reduce the P-well resistivity to produce a more uniform current distribution.

SUMMARY OF THE INVENTION

The present invention involves an apparatus and method embodied in an improved combination of elements for an ESD protection device for CMOS circuits, particularly a plurality of NMOS devices arranged as parallel N-P-N bipolars, in VLSI circuits. In such MOSFET circuits, a number of sets of cooperating N+ regions are deposited in a P-well in a P-type substrate to form, with electrodes and connections, a set of parallel source-base-drain transistors. The ESD pass voltage is effected by different processes due to the current-crowding effect. The current distribution in each of the N-P-N bipolars is strongly dependent on the P-well resistivity. To reduce the current crowding effect and render the current distribution uniform in each parallel N-P-N bipolar, in accordance with the invention, an additional P-well implantation is used to reduce the P-well resistivity in the input, I/O, and output buffer ESD protection circuits. Accordingly, the effective protection width will be increased and improve the ESD performance.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
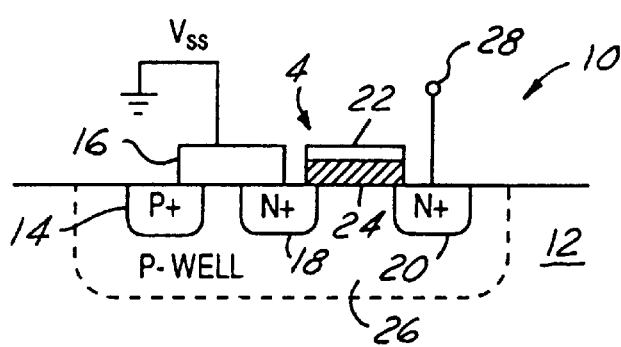
FIGS. 1 and 1A are illustrations in section of a semiconductor gating device and in a circuit diagram used as an ESD protection circuit in accordance with the prior art.
Figure 1A:
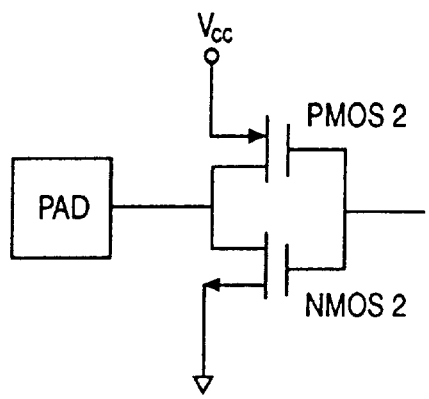
Figure 2:
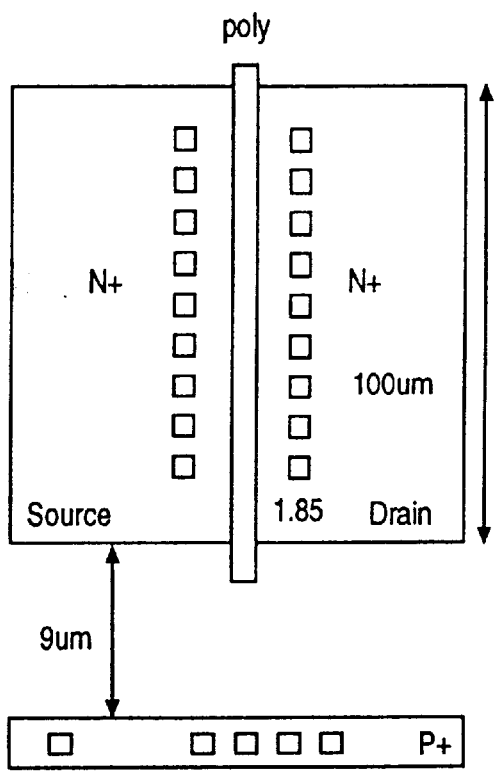
FIG. 2 is a plan view illustrating a semiconductor IC chip layout including a plurality of parallel ESD protection circuits such as shown in FIG. 1.
Figure 3:
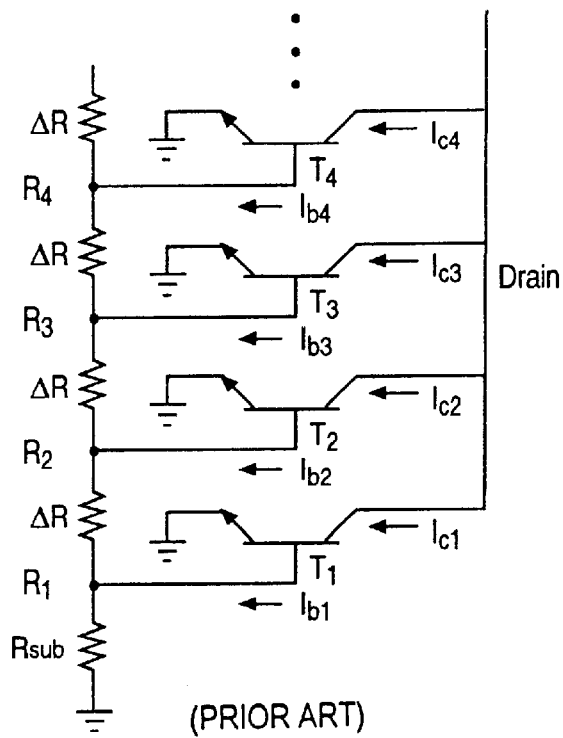
FIG. 3 is a schematic of an equivalent circuit diagram of the parallel ESD protection circuits of FIG. 1.

The present invention provides an apparatus and method for protecting VLSI circuits having parallel CMOS devices therein from ESD damage and is embodied in an improved combination of steps and elements that act to reduce the current crowding effect and render the current distribution uniform in each parallel bipolar device. The pads that interconnect a VLSI semiconductor chip with external circuits are typically provided with protection circuits that turn-on when an excessive voltage appears at a Pad, commonly caused by an ESD, to avoid possible internal damage to the chip circuits, such as the buffer circuits at an input Pad and the driver circuits at an output Pad. The protection circuit for CMOS devices may involve PMOS or NMOS FETs which form a PNP bipolar transistor or an NPN bipolar transistor under ESD stress. In particular, NMOS transistors have the lowest breakdown voltage in CMOS technology. As explained above, a prior art thin-oxide NMOS field-effect transistor (MOSFET) 4, is shown in the FIG. 1 in the form of an N-channel device, composed of N+ regions, 18 and 20, in a P-well 26 and having a gate electrode 22 with a thin oxide 24 therebetween. In prior art IC chips these MOSFETs are arranged in sets of parallel NMOS devices as shown in FIG. 2. An equivalent circuit schematic is seen in FIG. 3 showing an array of parallel NMOS devices T1, T2, T3, T4, . . . etc., and their respective base currents Ib1, Ib2, Ib3, Ib4 . . . etc. and drain currents Ic1, Ic2, Ic3, Ic4 . . . etc. The resistance Rsub between the substrate and transistor T1, and the successive resistances between the successive transistors ($\Delta R$) are indicated as R1, R2, R3, R4 . . . etc. The relationships among these parameters are as follows: R1<R2<R3<R4 . . . etc.; Ic1>Ic2>Ic3>Ic4 . . . etc.; and Ib1>Ib2>Ib3>Ib4 . . . etc. A problem with this arrangement, however, is that the ESD pass voltage is effected by different processes due to current crowding and the uniformity of the current distribution is effected.

In order to overcome this problem it has been appreciated that the current distribution in each of the N-P-N bipolars is strongly dependent on the P-well resistivity so that the P-well resistivity should be reduced. Accordingly the invention involves adding a P$^-$ well to the conventional N-channel device, by means of a second doping, e.g., with boron ions, B$^-$, at the same places as the original P-well, i.e., the I/O, input and output areas. The second doping may be done using another mask and an implantation energy which depends on the process.

Figure 4:
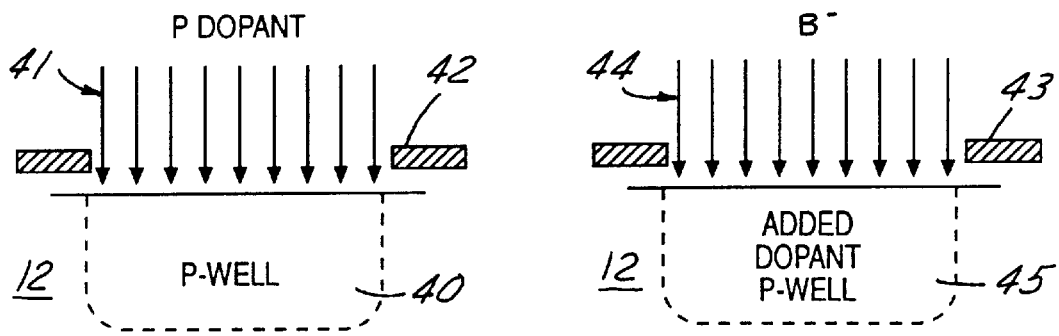
FIG. 4 is a diagrammatic illustration in section of the performing of the double dosing of the P-well in am ESD protection circuit formed in accordance with the present invention.

As shown in FIG. 4, an original P-well 40 is formed by implanting a dopant 41 using a conventional mask 42 and process. After the original P-well is completed, a second doping is performed in the same place using another mask 43 and process including a B$^-$ dopant 44. The process parameters may be varied depending on the ESD protection and current results desired. When the second doping is completed, an added dopant P-well 45 will be formed with a decreased resistivity. The added dopant P-well 45 so formed will promote uniform current distribution in each parallel N-P-N bipolar device, and the effective protection width will be increased and the ESD performance improved.

As noted above, the doped P-well regions will be implanted in the I/O, input, and output areas of the buffer ESD protection circuits on IC chip to provide improved ESD protection at those areas.

It will therefore be seen that an apparatus and method have been presented that enhance the operation of the ESD protective circuits in VLSI chips and particularly with a set of parallel NMOS devices therein to prevent damage thereto. Whereas the conventional ESD protection devices have a comparatively high P-well resistivity, the additional doping of the invention lowers the resistivity of the P-well in each of the parallel NMOS devices to produce enhanced uniformity in the current distribution and reduce the current crowding effect in the devices.

While the present invention has been described in an illustrative manner, it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations within the scope of the invention.

The embodiments of the invention in which an exclusive property or privilege is claimed are defined in the following claims:

1. Apparatus for enhancing the operation of ESD protective circuits in a VLSI chip having a plurality of parallel CMOS devices therein, with each of said CMOS devices comprising:

a first outer region of one conductivity type and a first inner region of one conductivity type formed adjacent to each other in a well region of opposite conductivity type disposed in a substrate of opposite conductivity type;

a first contact connected to said first outer region;

a second outer region of opposite conductivity type disposed in said well region of opposite conductivity type adjacent said first inner region on the side opposite from said first outer region; and a second contact connected to a Vss source and coupling said second outer region of opposite conductivity type and said inner region of one conductivity type;

wherein the improvement comprises:

said well region has a second doping dosage of a conductivity type to reduce the resistivity of said well region and produce uniform current distribution among said CMOS devices.

2. Apparatus as in claim 1 wherein said one conductivity type is N+, said opposite conductivity type is P+, and the conductivity type of said second dopiing dosage is P−.

3. Apparatus as in claim 1 wherein said second doping dosage is with boron.

4. Apparatus as in claim 3 wherein said boron comprises ions of B−.

5. Apparatus as in claim 1 wherein said first contact is electrically connected to one of an I/O pad, a source voltage, and the internal circuits of said chip.

6. Apparatus for enhancing the operation of ESD protective circuits in a VLSI chip having a P-type substrate containing a plurality of parallel CMOS devices therein, each of said CMOS devices comprising:

an I/O Pad contact on said chip;

a first contact on said chip coupled to a Vss source;

a P-well disposed in the P-type substrate of said chip;

an outer P+ region and an inner N+ region disposed adjacent to each other in said P-well and connected to said first Vss contact; and an outer N+ region disposed in said P-well adjacent said inner N+ region on the side opposite from said outer P+ region and connected to said I/O Pad contact;

wherein the improvement comprises:

said P-well has a second doping dosage of conductivity type to reduce the resistivity of said P-well and produce uniform current distribution among said CMOS devices.

7. Apparatus as in claim 6 wherein said second doping dosage comprises boron.

8. Apparatus as in claim 7 wherein said boron comprises ions of B−.

9. Apparatus as in claim 6 wherein said P-wells having a second doping dosage are disposed in I/O, input, and output areas of said chip.

* * * * *